US009143245B2

(12) United States Patent
Hao

(10) Patent No.: US 9,143,245 B2
(45) Date of Patent: Sep. 22, 2015

(54) METHODS AND DEVICES FOR ACQUIRING CONTINUOUS PHYSICAL SIGNALS

(76) Inventor: Yushan Hao, Baoding (CN)

(*) Notice: Subject to any disclaimer, the term of this patent is extended or adjusted under 35 U.S.C. 154(b) by 0 days.

(21) Appl. No.: 14/125,012

(22) PCT Filed: Jun. 11, 2012

(86) PCT No.: PCT/CN2012/076697
§ 371 (c)(1),
(2), (4) Date: Dec. 9, 2013

(87) PCT Pub. No.: WO2012/167749
PCT Pub. Date: Dec. 13, 2012

(65) Prior Publication Data
US 2014/0126619 A1    May 8, 2014

(30) Foreign Application Priority Data
Jun. 9, 2011  (CN) .......................... 2011 1 0161133

(51) Int. Cl.
*H04B 17/00* (2015.01)
*H03H 17/06* (2006.01)
*G01D 9/00* (2006.01)

(52) U.S. Cl.
CPC ........... *H04B 17/00* (2013.01); *H03H 17/0621* (2013.01); *G01D 9/005* (2013.01)

(58) Field of Classification Search
CPC .................................................. H04B 17/00
USPC ........................................................ 375/224
See application file for complete search history.

(56) References Cited

U.S. PATENT DOCUMENTS

| 5,381,335 A | 1/1995 | Wolf |
| 2009/0052293 A1* | 2/2009 | Conway et al. ............... 369/59.1 |

FOREIGN PATENT DOCUMENTS

| CN | 1926413 A | 3/2007 |
| CN | 101285692 A | 9/2009 |

(Continued)

OTHER PUBLICATIONS

International Searching Authority, "Search Report," issued in connection with International Application No. PCT/CN2012/076697, mailed on Dec. 13, 2012, 5 pages.

(Continued)

*Primary Examiner* — Kevin M Burd
(74) *Attorney, Agent, or Firm* — Troutman Sanders LLP

(57) ABSTRACT

Provided is a method for acquiring continuous physical signal such as temperature, pressure and the like. The method comprises the following steps: inputting a voltage signal u representing continuous physical signal; obtaining a sampled signal $u_k$ of an analog voltage through an analog sampling channel (1), wherein the sampling frequency is $f\Delta h$; performing digital low-pass filtering on the $u_k$ (6) to obtain a voltage signal $\tilde{u}_k$ subjected to low-pass filtering, and resampling the $\tilde{u}_k$ to obtain a resample signal $\hat{u}_j$, wherein the resampling frequency $f\Delta y$ is the same as the sampling frequency required by an application terminal and the sampling frequency $f\Delta h$ is M times of the resampling frequency $f\Delta y$; and storing and outputting the resample signal $\hat{u}_j$ to the application terminal. Provided also is a corresponding device. The cost of the analog sampling channel is lowered; the $\bar{u}_j$ can be directly applied to industrial automation for substitution of the $\hat{u}_j$, especially output signals do not contain transient values, the requirements of a stable model on input quantity can be met, the random disturbance can be inhibited, and the measurement accuracy can be improved.

11 Claims, 1 Drawing Sheet

(56) References Cited

FOREIGN PATENT DOCUMENTS

| | | | |
|---|---|---|---|
| CN | 10161455 | A * | 12/2009 |
| CN | 101614554 | A | 12/2009 |
| CN | 101614555 | A | 12/2009 |
| CN | 102331535 | A | 1/2012 |
| CN | 102393214 | A | 3/2012 |
| JP | 2009204470 | A | 9/2009 |
| WO | 2010074643 | A1 | 7/2010 |

OTHER PUBLICATIONS

International Searching Authority, "Written Opinion," issued in connection with International Application No. PCT/CN2012/076697, mailed on Dec. 9, 2013, 7 pages.

International Searching Authority, "International Preliminary Report on Patentability," issued in connection with International Application No. PCT/CN2012/076697, mailed on Dec. 10, 2013, 8 pages.

* cited by examiner

METHODS AND DEVICES FOR ACQUIRING CONTINUOUS PHYSICAL SIGNALS

TECHNICAL FIELD

The invention relates to digital measurements and acquiring technology of a continuous physical signals, particularly, to method and device for measuring and acquiring continuous physical signals in heat engineering, chemical engineering, metallurgy and electric power fields such as temperature, pressure, flow, voltage, concentration, current, power, rotate speed, etc.

BACKGROUND

In industrial automation, there is requirement for measuring and acquiring data (data acquiring for short below) for the continuous physical signals such as temperature, pressure, flow, voltage, concentration, etc. The analog signals should be sampled through the analog sampling channel according to the requirement of the signal application terminals, and the sample frequency is $f\Delta y$. In order to avoid frequency mixing, it is required to set an analog low-pass filter, whose cutoff frequency $fc<0.5\times f\Delta y$, in the analog sampling channel. Since $f\Delta y$ is smaller, fc will be so small that cost and difficulty of the analog low-pass filter is increased.

Further, most of industrial automation adopts a steady state model which needs the data acquired steady state value of the physical signal. The Chinese Invention Patent No. ZL200910158375.x and ZL200910158370.7 (the inventor is HAO, Yushan and the invention title is "Measuring Device and Method for Continuous Physical Signal") provides measuring and recording the steady state data and full state data for the common physical signal, but the output frequency does not accord with the above data acquiring frequency, and the output content is relative more (including start and stop time, etc.), thus it is not convenient to directly apply to the industrial automation.

SUMMARY

The purpose of the present invention aims at providing methods and devices for measuring and acquiring continuous physical signals to solve the above problems.

The method for acquiring continuous physical signals in the present invention comprises the following steps:

inputting a voltage signal u representing continuous physical signal; sampling the voltage signal u to obtain a sampled signal $u_k$ through an analog sampling channel, wherein the sampling frequency is $f_{\Delta h}$;

resampling the sampled signal $u_k$ to obtain a resampled signal $u_j$, wherein the resampling frequency $f_{\Delta y}$ is specified by its application; and it further comprises: obtaining $\tilde{u}_k$ by digital low-pass filtering the sampled signal $u_k$ before the resampling;

resampling the $\tilde{u}_k$ to obtain resample signal $\tilde{u}_j$;

storing the resample signal $\tilde{u}_j$ and outputting it to the application terminal.

The digital low-pass filtering cutoff frequency $f_c<0.5\times f_{\Delta y}$, thus avoiding frequency mixing error that may be brought by the resampling.

The analog low-pass filtering cutoff frequency $fc<0.5\times f_{\Delta h}$, since $f_{\Delta h}$ is larger than $f_{\Delta y}$ for multiple times, the fc of the analog low-pass filter can be increased for many times by the present method as compared to the method without digital low-pass filtering and resampling. Thus, the difficulty and cost of the analog low-pass filter is lowered by the present method, and that the cost of the fast analog-to-digital convertor especially the $\Delta$-$\Sigma$analog-to-digital convertor is very low.

The transfer function of the digital low-pass filtering is as follows:

$$G(z) = \frac{1}{a_0 + a_1 \cdot z^{-1} + \ldots + a_n \cdot z^{-n}}$$

wherein, n=2, 4, 6, 8, which is the order of the filter, G(z) is the common special functions such as an nth-order Butterworth or nth-order Chebyshev filter.

According to an aspect of the present invention, the said digital low-pass filtering is a structure averaging algorithm that:

judging $u_k$ is in the steady state or the transient state by sign F, if F=1, $u_k$ is in the transient state, and if F=0, $u_k$ is in the steady state;

if F=0, obtaining an average value $\bar{u}_k$ by using the sampled signal $u_k$;

if F=1, the average value $u_k$ being an unreachable value of the sampled signal $u_k$ in practical application, and eliminating the unreachable value in the $\bar{u}_j$ as bad data after arriving at the application terminal;

if F turns to 0 from 1, resetting the average value $\bar{u}_k$ and setting k=1.

The calculation formula of the average value is:

$$\bar{u}_k = \frac{1}{k} \cdot \sum_{l=1}^{k} u_l = \frac{1}{k} \cdot [(k-1) \cdot \bar{u}_{k-1} + u_k)].$$

The criterion for judging $u_k$ is in the steady state or in the transient state is calculating the variance of the input signal $u_k$, $$\hat{s}_k^2 = \frac{k-2}{k-1}\hat{s}_{k-1}^2 + (\bar{u}_k - \bar{u}_{k-1})^2 + \frac{1}{k-1}(\bar{u}_k - u_k)^2,$$

and if $|u_k - \bar{u}_k| \le \sqrt{k} \cdot t_{\alpha/2}(k-1) \cdot \hat{s}_k$, $u_k$ is in the steady state, otherwise $u_k$ is in the transient state, wherein $\bar{u}_k$ is the average value, $t_{\alpha/2}$ is the students distribution, and $\alpha$ is the level of risk.

According to another aspect of the present invention, the said digital low-pass filtering is variable structure $\alpha\beta\gamma$ filter that:

performing $\alpha\beta\gamma$ filtering on the inputting signal $u_k$ and obtaining the location component $S_k$, the speed component $v_k$ and the acceleration component $a_k$ of the $u_k$; the location component $S_k$ is the output of the digital low-pass filter;

judging $u_k$ is in the steady state or the transient state by sign F, if $|a_k|<a_g$ and $|v_k|<v_g$, $u_k$ is in the steady state and F=0, keeping $S_k$ invariably; otherwise, $u_k$ is in the transient state and F=1, $S_k$ being an unreachable value of sampled signal $u_k$ in the practical application, wherein the $a_g$ and $u_g$ are given values, and the they relates to the bandwidth and the time constant of the signal $u_k$.

resampling, obtain $S_j$ from $S_k$; and eliminating the unreachable value in the $S_j$ as bad data after arriving at the application terminal; if F turns to 0 from 1, resetting $S_k$ to zero and setting k=1.

In practical application, the criterion for judging that $u_k$ is in the steady state or in the transient state can be further simplified. If any one of $|a_k|<a_g$ and $|v_k|<v_g$ is satisfied, $u_k$ is in the steady state, otherwise, $u_k$ is in the transient state.

The present invention also provides a device for acquiring continuous physical signals, comprising:

an analog sampling channel (1), used for implementing analog sample on the voltage signal u of the input continuous physical signal, wherein the sampling frequency being $f_{\Delta h}$, and outputting the sampled signal $u_k$;

a resampling switch (5), used for resampling the sampled signal $u_k$ to obtain the resample signal $u_j$ and outputting the resample signal $u_j$ to a register (2);

the register (2), used for storing the resample signal $u_j$;

a bus (3), used for controlling the register (2) to output data $u_j$ to the bus (3), and outputting data via the bus (3) to the application terminal; and a timing controller (4), used for controlling analog sampling channel (1) and the resampling switch (5);

and further comprising:

a digital low-pass filter (1), for receiving the sampled signal $u_k$ of the analog voltage from the analog sampling channel (1), low-pass filtering them and outputting the signal $\tilde{u}_k$. The cutoff frequency fc of the digital low-pass filter (6) is smaller than 0.5 times of the resampling frequency $f_{\Delta y}$, and the cutoff frequency fc of the analog low-pass filter in the analog sampling channel is smaller than 0.5 times of the sampling frequency $f_{\Delta h}$.

According to an aspect of the device for acquiring continuous physical signals of the present invention, in the above said solution, said digital low-pass filter (6) may also be comprised by an averaging unit (7) and a judging unit (8).

Said judging unit (8) inputs the sampled signal $u_k$ from the analog sampling channel (1) to obtain the sign F and outputs it to the averaging unit (7); when the sampled signal $u_k$ is in the steady process, F=0, otherwise, when the sampled signal $u_k$ is in the transient process, F=1;

Said averaging unit (7) inputs the sampled signal $u_k$ from the analog sampling channel (1), calculates the average value $\bar{u}_k$ if F=0; and assigns an unreachable value of $u_k$ (e.g. the maximum value impossible occurred) to the average value $\bar{u}_k$, output $\bar{u}_k$ to resample switch (5), obtain $\bar{u}_j$ from $\bar{u}_k$; and the unreachable value of $\bar{u}_j$ may be eliminated as bad data after arriving at the application terminal; when F turns to 0 from 1, said average value $\bar{u}_k$ is reset and let k=1; the average value $\bar{u}_k$ is output to the resampling switch.

The calculation formula of the average unit (7) is:

$$\bar{u}_k = \frac{1}{k} \cdot \sum_{l=1}^{k} u_l = \frac{1}{k} \cdot [(k-1) \cdot \bar{u}_{k-1} + u_k)].$$

The judging unit (8) is calculating the variance of the input signal $u_k$, $$\hat{s}_k^2 = \frac{k-2}{k-1}\hat{s}_{k-1}^2 + (\bar{u}_k - \bar{u}_{k-1})^2 + \frac{1}{k-1}(\bar{u}_k - u_k)^2,$$

and if $|u_k - \bar{u}_k| \leq \sqrt{k} \cdot t_{\alpha/2}(k-1) \cdot \hat{s}_k$, is in the steady state, otherwise $u_k$ is in the transient state, wherein $\bar{u}_k$ is the average value, $t_{\alpha/2}$ is the students distribution, and α is the level of risk.

According to another aspect of the device for acquiring continuous physical signals of the present invention, said digital low-pass filter also may be a variable structure αβγ filter (6).

The αβγ filter implements αβγ filtering on the input signal $u_k$ and obtains the location component $S_k$, the rate component $v_k$ and the acceleration component $a_k$ of the $u_k$;

If $|a_k| < a_g$ and $|v_k| < v_g$, $u_k$ is in the steady state, F=0 and $S_k$ is kept invariant; otherwise, $u_k$ is in the transient state, F=1 and $S_k$ is an unreachable value of $u_k$ in the practical application, wherein $a_g$ and $v_g$ are given values, and they relates to the bandwidth and the time constant of $u_k$; output $S_k$ to resample switch (5), obtain $S_j$ from $S_k$; and the unreachable value in the $S_j$ is eliminated as bad data after arriving at the application terminal; when F turns to 0 from 1, $S_k$ is reset and let k=1; $S_k$ is output to the resampling.

In practical application, the above said criterion can be simplified, for example, only one of $|a_k| < a_g$ and $|v_k| < v_g$ is used as the criterion. $u_k$ is in the steady state or in the transient state.

As the digital low-pass filter and resampling switch are applied, the analog sampling channel can apply inexpensive ADC and inexpensive analog low-pass filter, thereby lowering the cost of analog sampling channel.

$\bar{u}_j$ or $S_j$ can be directly applied to industrial automation, especially $\bar{u}_j$ or $S_j$ do not contain transient values, thus the requirements of a steady state model on input signal can be met, the random disturbance can be inhibited, and the measurement accuracy can be improved.

DETAILED DESCRIPTION OF PREFERRED EMBODIMENTS

Figure 1:
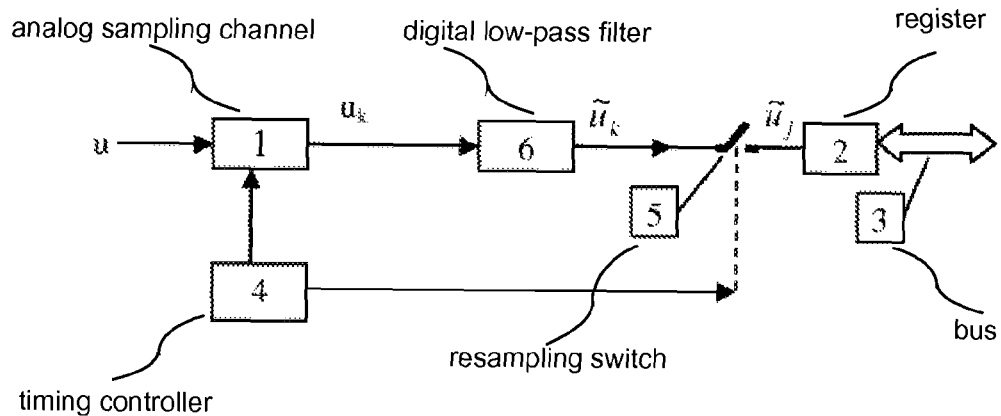
FIG. 1 shows methods and devices for acquiring continuous physical signals in the present invention.

FIG. 1 provides a method and device for acquiring continuous physical signals.

In FIG. 1, included analog sampling channel 1, register 2, bus 3 and timing controller 4, and the contribution of the inventor is that the resampling switch 5 and digital low-pass filter 6 are also included. The voltage signal u of the continuous physical signal is input and passed through the analog sampling channel 1 to obtain the sampled value $u_k$ of the analog voltage; the sampled value $u_k$ is passed through the digital low-pass filter 6 to remove the high frequency by filtration to avoid the frequency mixing error that may be brought during the subsequent resampling process, and ouput $\tilde{u}_k$ undergone by the low-pass filtering; the filtered signal $\tilde{u}_k$ is output to the resampling switch 5 to be resampled, and the resample value $\tilde{u}_j$, is output and stored in the register 2, which will be output, by the bus 3, to the application terminal by the register 2 under the control of the bus 3; the analog sampling channel 1 and the resampling switch 5 are controlled by the timing controller 4.

The cutoff frequency $f_c$ of the digital low-pass filter is smaller than 0.5 times of the resampling frequency $f_{\Delta y}$, and the resampling frequency $f_{\Delta y}$ is specified by its application.

Figure 2:
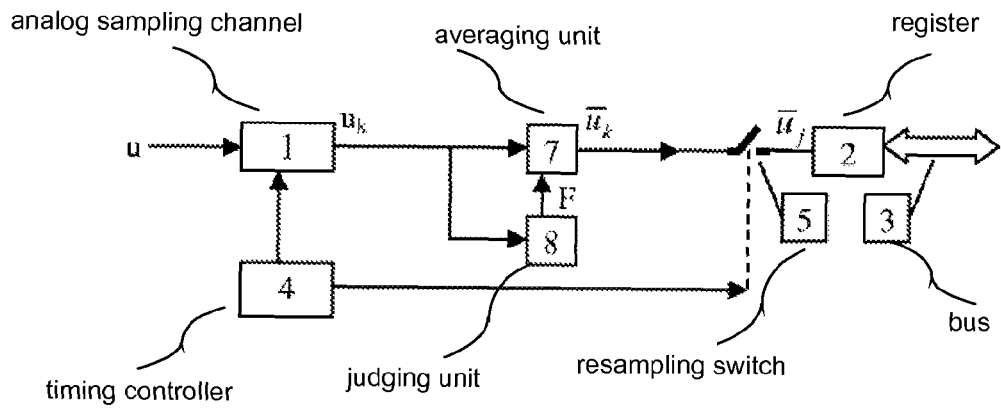
FIG. 2 shows methods and devices for acquiring steady state value data of the continuous physical signals in the present invention.

FIG. 2 shows a method and device for acquiring the steady state value data of the continuous physical signal.

In FIG. 2, the digital low-pass filter 6 of the FIG. 1 is replaced by the averaging unit 7 and the judging unit 8 of the FIG. 2, and the other circuit configuration and function are the same as the description of the FIG. 1. In FIG. 2, the output $u_k$ of the analog sampling channel 1, in one aspect, is passed through the averaging unit 7 to provide the average value $\bar{u}_k$, and it is then passed through the resampling switch 5 to be stored in the register 2; in another aspect, $u_k$ is inputted to the judging unit 8 to output the sign F to the averaging unit 7; when $u_k$ is in the steady state process, F=0, otherwise when $u_k$ is in the transient state process, F=1; wherein, when F=0, the averaging unit 7 calculates the average value $\bar{u}_k$; when F=1, the average value $\bar{u}_k$ of the averaging unit 7 is assigned an unreachable value (e.g. the maximum value impossible occurred), and the unreachable value is eliminated as bad data after arriving at the application terminal, and if F turns to 0 from 1, the said average value $\bar{u}_k$ is reset to zero and set k=1; the average value $\bar{u}_k$ is output to the resampling switch.

The formula for calculating the average value $\bar{u}_k$ is:

$$\bar{u}_k = \frac{1}{k} \cdot \sum_{l=1}^{k} u_l = \frac{1}{k} \cdot [(k-1) \cdot \bar{u}_{k-1} + u_k)].$$

The criterion of the judging unit 8 is calculating the variance of the sampled signal $u_k$, $$\hat{s}_k^2 = \frac{k-2}{k-1}\hat{s}_{k-1}^2 + (\bar{u}_k - \bar{u}_{k-1})^2 + \frac{1}{k-1}(\bar{u}_k - u_k)^2$$

and if $|u_k - \bar{u}_k| \leq \sqrt{k} \cdot t_{\alpha/2}(k-1) \cdot \hat{s}_k$, $u_k$ is in the steady state, otherwise $u_k$ is in the transient state, wherein $\bar{u}_k$ is the average value, $t_{\alpha/2}$ is the students distribution, and a is the level of risk.

Figure 3:
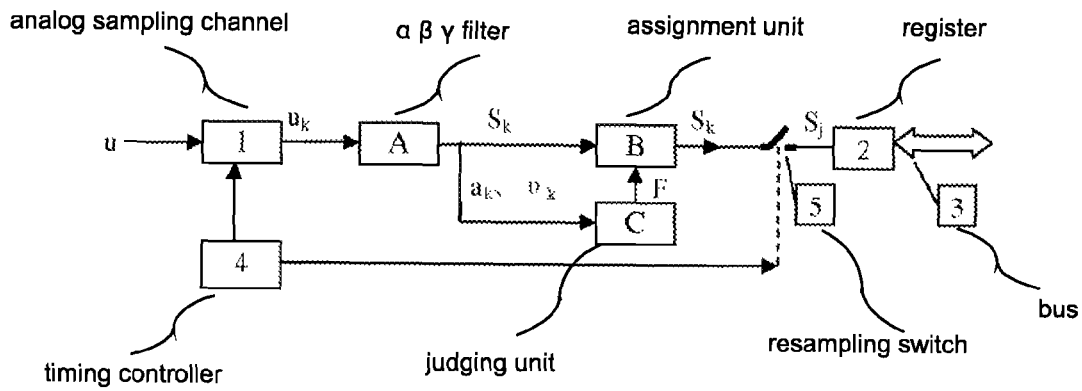
FIG. 3 shows methods and devices for acquiring steady state data of the continuous physical signals in the present invention.

FIG. 3 shows another method and device for acquiring the steady state value data of the continuous physical signal. In FIG. 3, the digital low-pass filter 6 of the FIG. 1 is replaced by the $\alpha\beta\gamma$ filter (A), the assignment unit (B) and the judging unit (C) of the FIG. 3 and the other circuit configuration and function are same as the description of the FIG. 1. In FIG. 3, the output $u_k$ of the analog sampling channel 1 is passed through the $\alpha\beta\gamma$ filter (A) to output the location component $S_k$, the rate component vk and the acceleration component $a_k$. The location component $S_k$ (i.e. the output of the filter) passed through the assignment unit (B), is resampled by switch 5 and then is stored in the register 2; the rate component vk and the acceleration component $a_k$ are input to the judging unit (C), and when $u_k$ is in the steady state, F=0, otherwise when $u_k$ is in the transient state, F=1; and the sign F is output to the assignment unit (B) by the judging unit (C); when F=0, the output of the assignment unit (B) is equal to the location component $S_k$, and when F=1, the output of the assignment unit (B) is equal to an unreachable value of $u_k$, and the unreachable value may be eliminated as bad data after arriving at the application terminal.

The criterion of the judging unit (C) is that: if $|a_k| < a_g$ and $|v_k| < v_g$, $u_k$ is in the steady state, and F=0; otherwise $u_k$ is in the transient state and F=1.

The criterion of the judging unit (C) is permitted to be simplified that: if any one of $|a_k| < a_g$ and $|v_k| < v_g$ is satisfied, for example if $|a_k| < a_g$ and $|v_k| \geq v_g$ (or, $|v_k| < v_g$ and $|a_k| \geq a_g$) is satisfied, $u_k$ for example if $|a_k| \geq a_g$ and $|v_k| \geq v_g$, $u_k$ is in the transient state, wherein the $a_g$ and $u_g$ are given values, and they relates to the bandwidth time constant of the signal $u_k$. See relevant information for $\alpha\beta\gamma$ filter design or Kalman filter design.

The above said solutions can be implemented by the CPLD (Complex Programmable Logic Device), FPGA (Field-Programmable Gate Array), ASIC (Application Specific Integrated Circuit) or the similar digital circuit, and they also can be implemented by the program of the DSP (Digital Signal Processor), and the specification can be seen in the development manual. The above said implementing solutions can also be integrated completely within one chip to implement.

While some specific embodiments have been provided by the embodiments of the present invention, various changes can be made to the embodiments by those skilled in the art without departing from the spirit and conception of the present invention, which will all be fallen into the scope defined by the claims of the present invention.

What is claimed is:

1. A method for acquiring continuous physical signals comprising:
    inputting a voltage signal u representing continuous physical signal;
    obtaining a sampled signal $u_k$ by sampling the voltage signal u through an analog sampling channel, wherein the sampling frequency is $f_{\Delta h}$; and
    obtaining the resample signal $u_j$ by resampling the sampled signal $u_k$, wherein the resampling frequency $f_{\Delta y}$ is specified by its application, wherein it further comprising:
    performing digital low-pass filtering on the sampled signal $u_k$ to obtain $\tilde{u}_k$ before the resampling,
    resampling the $\tilde{u}_k$ to obtain a resample signal $\tilde{u}_j$, and
    storing resample signal $\tilde{u}_j$ and outputting it to the application terminal,
    characterized in that said digital low-pass filtering is an averaging algorithm with variable structure that:
    judging $u_k$ is in the steady state or in the transient state then giving a sign F, if F=1, $u_k$ is in the transient state, and if F=0, $u_k$ is in the steady state; when F=0, obtaining an average value $\bar{u}_k$ by using the sampled signal $u_k$; when F=1, average value $\bar{u}_k$ being an unreachable value of the sampled signal $u_k$ in practical application, resampling, obtain $\bar{u}_j$ from $\bar{u}_k$, and eliminating the unreachable value in the $\bar{u}_j$ as bad data after arriving at the application terminal; if F turns to 0 from 1, resetting the average value $\bar{u}_k$ to zero and set k=1.

2. The method for acquiring continuous physical signals of claim 1, characterized in that the cutoff frequency $f_c$ of said digital low-pass filter is smaller than 0.5 times of the resampling frequency $f_{\Delta y}$.

3. The method for acquiring continuous physical signals of claim 2, characterized in that the transfer function of said digital low-pass filtering is as follows:

$$G(z) = \frac{1}{a_0 + a_1 \cdot z^{-1} + \ldots + a_n \cdot z^{-n}}$$

wherein n=2, 4, 6, 8, which is the order of the filter; G(z) is a well-known special function such as an nth-order Butterworth or nth-order Chebyshev filter.

4. The method for acquiring continuous physical signals of claim 1, characterized in that said average value $\bar{u}_k$ is obtained by the calculation formula:

$$\bar{u}_k = \frac{1}{k} \cdot \sum_{l=1}^{k} u_l = \frac{1}{k} \cdot [(k-1) \cdot \bar{u}_{k-1} + u_k)].$$

5. The method for acquiring continuous physical signals of claim 1, characterized in that the criterion for judging $u_k$ is in the steady state or in the transient state is calculating the variance of the sampled signal $u_k$, $$\hat{s}_k^2 = \frac{k-2}{k-1}\hat{s}_{k-1}^2 + (\bar{u}_k - \bar{u}_{k-1})^2 + \frac{1}{k-1}(\bar{u}_k - u_k)^2,$$

if $|u_k - \bar{u}_k| \leq \sqrt{k} \cdot t_{\alpha/2}(k-1) \cdot \hat{s}_k$, $u_k$ is in the steady state, otherwise $u_k$ is in the transient state, wherein $\bar{u}_k$ is the average value, $t_{\alpha/2}$ is the students distribution, and α is the level of risk.

6. The method for acquiring continuous physical signals of claim 1, characterized in that said digital low-pass filtering is variable structure αβγ filter that:

performing αβγ filtering on the sampled signal $u_k$ and obtaining the location component $S_k$, the rate component $v_k$ and the acceleration component $a_k$ of $u_k$; the location component $S_k$ being the output of the digital low-pass filter;

judging whether $u_k$ is in the steady state or the transient state, give a sign F: if $|a_k| < a_g$ and $|v_k| < v_g$, $u_k$ is in the steady state and F=0, keeping $S_k$ invariably; otherwise, $u_k$ is in the transient state and F=1, and $S_k$ being a unreachable value of $u_k$ in the practical application; wherein the $a_g$ and $v_g$ are given values, and they relates to the bandwidth and the time constant of the signal $u_k$;

resampling, obtain $S_j$ from $S_k$; and eliminating the unreachable value in the $S_j$ as bad data after arriving at the application terminal; when F turns to 0 from 1, resetting $S_k$ to zero and setting k=1; and outputting the $S_k$ to the resampling $v_g$.

7. The method for acquiring continuous physical signals of claim 6, characterized in that the criterion for judging $u_k$ is in the steady state or the transient state is simplified as: if any of $|a_k| < a_g$ and $|v_k| < v_g$ is satisfied, $u_k$ is in the steady state, otherwise, $u_k$ is in the transient state.

8. A device for acquiring continuous physical signals comprising:

an analog sampling channel, used for implementing analog sampling on the voltage signal u of the input continuous physical signal wherein the sampling frequency being $f_{\Delta h}$, and outputting the sampled signal $u_k$;

a resampling switch, used for resampling the sampled signal $u_k$ to obtain the resample signal $u_j$ and outputting the resample signal $u_j$ to a register; the register, used for storing the resample signal $u_j$;

a bus, used for controlling the register to output data $u_j$ to the bus and outputting data $u_j$ via the bus to the application terminal; and a timing controller, used for controlling analog sampling channel and the resampling switch;

and characterized in that it further comprises:

a digital low-pass filter, used for receiving the sampled signal $u_k$ from the analog sampling channel, implementing low-pass filtering on them and outputting the low-pass filtered signal $\tilde{u}_k$; the cutoff frequency fc of the digital low-pass filter being smaller than 0.5 times of the resampling frequency $f_{\Delta y}$, and the cutoff frequency fc of the analog low-pass filter in the analog sampling channel is smaller than 0.5 times of the sampling frequency $f_{\Delta h}$, characterized in that said digital low-pass filter comprises an averaging unit and a fudging unit:

said judging unit inputs the sampled signal $u_k$ from the analog sampling channel, and obtains a sign F and output it to the average unit; when the sampled signal $u_k$ is in the steady state F=0, otherwise when the sampled signal $u_k$ is in the transient state F=1;

said averaging unit inputs the samples signal $u_k$ from the analog sampling channel, and calculates the average value $\bar{u}_k$ when F=0; assigns an unreachable value of the $u_k$ to the average value $\bar{u}_k$ when F=1; and the unreachable value is eliminated as bad data after arriving at the application terminal; if F turns to 0 from 1, said average value $\bar{u}_k$ is reset and let k=1.

9. The device for acquiring continuous physical signals of claim 8, characterized in that the calculation formula of said averaging unit is:

$$\bar{u}_k = \frac{1}{k} \cdot \sum_{l=1}^{k} u_l = \frac{1}{k} \cdot [(k-1) \cdot \bar{u}_{k-1} + u_k)].$$

10. The device for acquiring continuous physical signals of claim 8, characterized in that the criterion of the judging unit is calculating the variance of the sampled signal $u_k$, $$\hat{s}_k^2 = \frac{k-2}{k-1}\hat{s}_{k-1}^2 + (\bar{u}_k - \bar{u}_{k-1})^2 + \frac{1}{k-1}(\bar{u}_k - u_k)^2,$$

if $|u_k - \bar{u}_k| \leq \sqrt{k} \cdot t_{\alpha/2}(k-1) \cdot \bar{s}_k$, $u_k$ is in the steady state, otherwise $u_k$ is in the transient state, wherein $\bar{u}_k$ is the average value, $t_{\alpha/2}$ is the students distribution, and α is the level of risk.

11. The device for acquiring continuous physical signals of claim 8, characterized in that said digital low-pass filter is a variable structure αβγ filter, and it implements αβγ filtering on the sampled signal $u_k$ from the analog sampling channel and obtains the location component $S_k$, rate component $v_k$ and the acceleration component $a_k$ of $u_k$;

judging whether $u_k$ is in the steady state or the transient state, give a sign F: if $|a_k| < a_g$ and $|v_k| \leq v_g$, $u_k$ is in the steady state, F=0 and $S_k$ is kept invariant; otherwise, $u_k$ is in the transient state, F=1 and $S_k$ is the unreachable value of $u_k$ in the practical application, wherein the $a_g$ and $v_g$ are given values, and the they relates to the bandwidth and the time constant of the signal $u_k$;

output $S_k$ resampling switch, obtain $S_j$ from $S_k$;

and the unreachable value in the $S_j$ is eliminated as bad data after arriving at the application terminal; when F turns to 0 from 1, $S_k$ is reset to zero and let k=1.

* * * * *